United States Patent [19]
Pricer

[11] Patent Number: 4,816,773
[45] Date of Patent: Mar. 28, 1989

[54] NON-INVERTING REPEATER CIRCUIT FOR USE IN SEMICONDUCTOR CIRCUIT INTERCONNECTIONS

[75] Inventor: Wilbur D. Pricer, Burlington, Vt.

[73] Assignee: International Business Machines Corporation, Armonk, N.Y.

[21] Appl. No.: 44,636

[22] Filed: May 1, 1987

[51] Int. Cl.$^4$ .............................. H03F 3/30
[52] U.S. Cl. ................. 330/267; 330/307
[58] Field of Search ........... 330/263, 264, 267, 268, 330/300, 307

[56] References Cited

U.S. PATENT DOCUMENTS

| | | | |
|---|---|---|---|
| 3,609,479 | 9/1971 | Lin et al. | 317/235 |
| 3,818,360 | 6/1974 | Boutmy et al. | 330/15 |
| 3,898,564 | 8/1975 | Waldhauer et al. | 325/13 |
| 4,002,928 | 1/1977 | Goser et al. | 307/251 |
| 4,029,907 | 6/1977 | Jorgensen et al. | 179/16 |
| 4,038,607 | 7/1977 | Schade, Jr. | 330/264 |
| 4,121,168 | 10/1978 | Stitt | 330/268 X |
| 4,159,450 | 6/1979 | Hoover | 330/265 |
| 4,210,885 | 7/1980 | Ho | 333/238 |
| 4,301,383 | 11/1981 | Taylor | 307/585 |
| 4,334,196 | 6/1982 | Schade, Jr. | 330/253 |
| 4,419,593 | 12/1983 | Butler et al. | 307/268 |
| 4,424,456 | 1/1984 | Shiraki et al. | 307/268 |
| 4,437,022 | 3/1984 | Miersch et al. | 307/270 |
| 4,499,387 | 2/1985 | Konishi | 307/443 |
| 4,508,981 | 4/1985 | Dorler et al. | 307/542 |

FOREIGN PATENT DOCUMENTS 140309  11/1980  Japan .................. 330/268

OTHER PUBLICATIONS

Cox, "Op Amp's Current Booster Ends Crossover Distortion," *Electronics*, Mar. 29, 1971, P70 330-268.

Primary Examiner—James B. Mullins
Attorney, Agent, or Firm—Sughrue, Mion, Zinn, Macpeak, and Seas

[57] ABSTRACT

A semiconductor non-inverting repeater circuit utilizes a pair of current mirrors operating in a balanced source/sink operation during non-input signal periods to provide quiescent biasing current to a pair of complementary bipolar output transistors. The bipolar output transistors are configured in a complementary emitter-follower arrangement to provide minimum delay. Finally, the circuit includes two diodes and two capacitors to supply a non-inverted input signal to the bipolar output transistors such that a non-inverted output signal is produced.

30 Claims, 2 Drawing Sheets

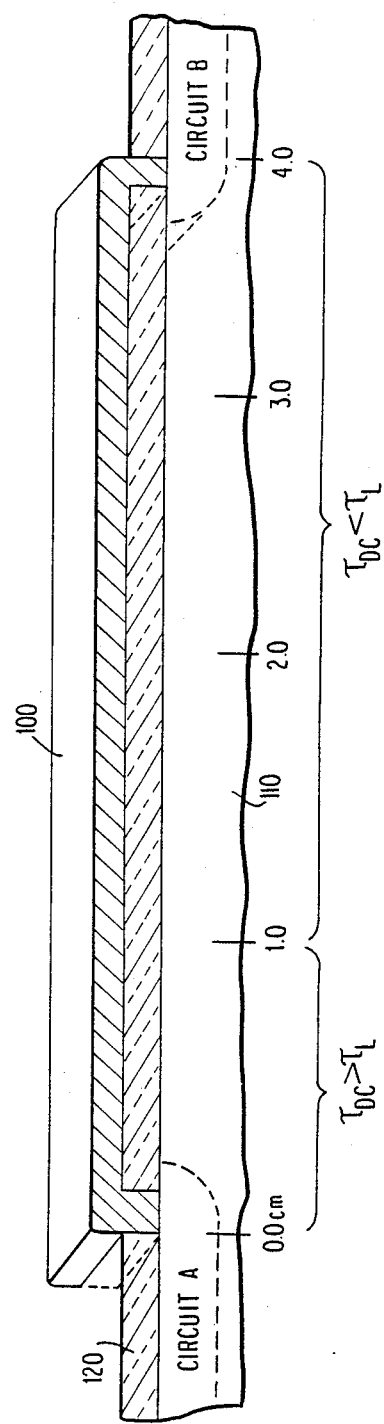
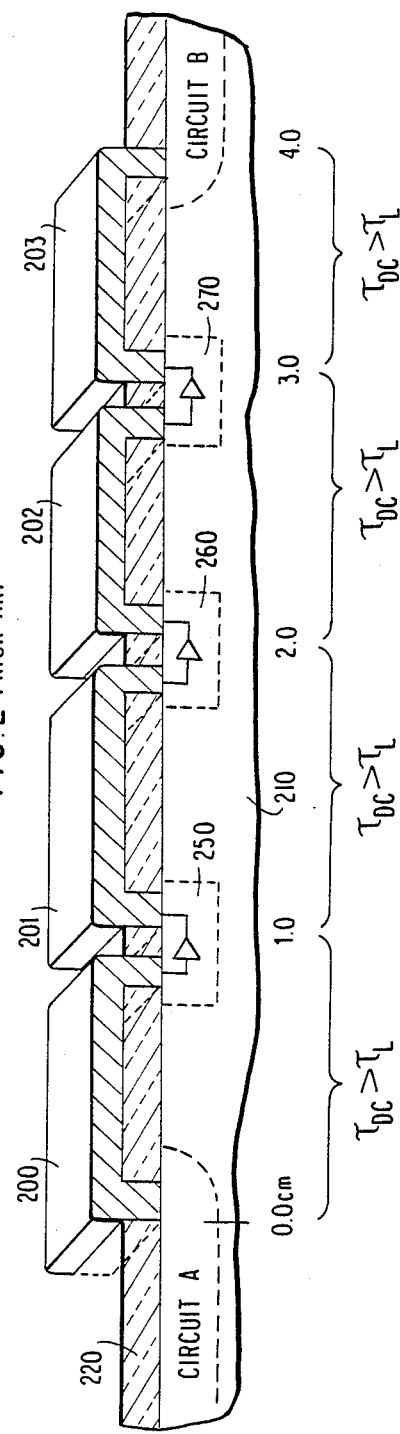

4,816,773

NON-INVERTING REPEATER CIRCUIT FOR USE IN SEMICONDUCTOR CIRCUIT INTERCONNECTIONS

BACKGROUND OF THE INVENTION

1. Field of the Invention

The present invention relates to a non-inverting repeater circuit for use in semiconductor circuit interconnections.

2. Background Art

In developing the transatlantic telegraph and telephone cables, it was found that signals traversing the cable length experienced a transient time degradation. This transient time degradation was found to be proportional to the square of the distance travelled, and was due to the distributed resistance and capacitance along the length of the cable. The problem was solved in cable technology by providing repeater amplifiers every few hundred miles along the cable.

In the development of very large integrated circuit chips, the same problem has been found to occur at much shorter distances. In FIG. 1, there is shown a cross-sectional view of a circuit interconnect 100 connecting a circuit A and a circuit B which are formed in a semiconductor substrate 110. The circuit interconnect 100 is typically formed of a metal (e.g., aluminum), and is insulated from the semiconductor substrate 110 by an oxide layer 120 except where the circuit interconnect 100 is to make contact with the circuit A or the circuit B.

To facilitate a discussion of the transient time degradation problem, the circuit interconnect 100 in FIG. 1 has been indicated as being 4 centimeters long. As a signal from circuit A begins traversing the circuit interconnect 100 toward circuit B, it begins to encounter resistance and capacitance along the length of the line. The resistance is due to the resistivity of the metal line, and is proportional to the length travelled. The capacitance is due to the separation of the circuit interconnect 100 from the semiconductor substrate 110 by the oxide layer 120, and is also proportional to the length travelled. Thus, as the distance a signal travels from circuit A to circuit B along the circuit interconnect 100 doubles, the resistance and capacitance associated with the circuit interconnect 100 also doubles. As the resistance and capacitance are each proportional to the length travelled, the transient time constant $\tau_L$ of the line, which is proportional to both the line resistance and capacitance, is thus proportional to the square of the length travelled.

In the example shown in FIG. 1, the resistance and capacitance encountered up to a distance of 1 centimeter are sufficiently small such that the transient time constant of the line $\tau_L$ is smaller than the transient time constant of the driving circuit $\tau_{DC}$. As the transient time constant of the line is smaller, transient time degradation will not be a concern. However, as the signal traverses beyond a distance of 1 centimeter, the overall resistance and capacitance encountered along the line are such that the transient time constant of the line $\tau_L$ quickly becomes greater than the transient time constant of the driving circuit $\tau_{DC}$. This in effect means that the rise and fall time associated with the line is greater than the rise or fall time of the driving circuit. As such, the signal traversing the circuit interconnect 100 beyond distances of 1 centimeter is subject to undesirable distortion. As the length traversed is increased, a corresponding increase in distortion of the signal is encountered. Note in FIG. 1 that, for distances less than 1 centimeter, the transient time constant of the line $\tau_L$ is indicated as being smaller than the transient time constant of the driving circuit $\tau_{DC}$. In contrast, for distances greater than 1 centimeter, the opposite is true.

It has long been proposed that long circuit interconnect problems on large scale integrated circuit chips be solved the same way that the long telegraph cable problem was solved, i.e. with repeater amplifier circuits. An example of this solution is illustrated in FIG. 2, In FIG. 2, the cross-sectional view shows a circuit interconnect consisting of a number of shorter circuit interconnects 200, 201, 202, and 203, and repeater amplifiers 250, 260, and 270. The circuit interconnects 200, 201, 202, and 203 are also typically formed of a metal (e.g. aluminum), and are shown separated from a semiconductor substrate 210 by an insulating oxide layer 220. The repeater amplifier circuits 250, 260, and 270 are typically semiconductor circuits formed at periodic intervals along the semiconductor substrate 210. The first circuit interconnect 200 interconnects circuit A with the input of a repeater amplifier circuit 250. A second circuit interconnect 201 interconnects the output of the repeater amplifier circuit 250 with the input of the repeater amplifier circuit 260. A third circuit interconnect 202 interconnects the output of the repeater amplifier circuit 260 with the input of the repeater amplifier circuit 270. Finally, the fourth circuit interconnect 203 interconnects the output of the repeater amplifier circuit 270 to the circuit B, Thus, there is shown a series circuit interconnection of circuit A with circuit B and consisting of the first circuit interconnect 200, the repeater amplifier circuit 250, the second circuit interconnect 201, the repeater amplifier circuit 260, the third circuit interconnect 202, the repeater amplifier circuit 270, and, finally, the fourth circuit interconnect 203. Note that the circuit interconnect 100 as shown in FIG. 1 has been effectively replaced with four shorter circuit interconnects 200, 201, 202, and 203, each being approximately 1 centimeter long in the example shown in FIG. 2.

Turning now to an operational description of the series circuit of FIG. 2, a signal outputted by a circuit A enters and traverses the circuit interconnect 200 to arrive at the input of the repeater amplifier circuit 250. The resistance and capacitance encountered by the signal along the shorter circuit interconnect 200 is sufficiently small, such that the transient time constant of the circuit interconnect 200 $\tau_L$ is smaller than the transient time constant of the driving circuit A $\tau_{DC}$. As the transient time constant of the line 200 is typically much less than the rise and fall time of the driving circuit A, transient time degradation of the signal along the line 200 is not a concern. Thus, the repeater amplifier circuit 250 receives a substantially unaffected signal from the circuit interconnection 200 at its input, and provides a repeated output signal at its output. The repeater amplifier circuit 250 then becomes the driving circuit for the signal traversing the second circuit interconnect 201.

As the repeated signal from the repeater amplifier circuit 250 traverses the second circuit interconnect 201, the resistance and capacitance encountered along the shorter circuit interconnect 201 are again sufficiently small such that the transient time constant of the line 201 $\tau_L$ is smaller than the transient time constant of the driving circuit 250 $\tau_{DC}$. Thus, it can be seen that the repeater amplifier circuit 260 also receives a substantially unaffected signal which is to be repeated. As similar effect occurs as the signal traverses the remainder of the line. In FIG. 2, note that the transient time constants $\tau_L$ associated with each of the circuit interconnections 200, 201, 202, and 203 are indicated as being smaller than the transient time constant $\tau_{DC}$ of the driving circuit A and the repeater amplifier circuits 250, 260 and 270, respectively. Thus, in the circuit interconnection and repeater amplifier circuit arrangement of FIG. 2, a signal can leave circuit A and arrive at a circuit B in such a manner that the transient time degradation encountered is not a concern.

In addition, and to meet the duty of disclosure of known prior art which may be material to the present application. Applicant cites the following patents and publication.

In particular, U.S. Pat. No. 4,159,450 issued to Hoover, discloses a complementary class B transistor amplifier stage having a pair of serially connected bipolar transistors in a common collector arrangement in the output circuitry. Also included is a pair of FETs which is connected to receive the input signal and operate as a push-pull driver arrangement to supply an inverted signal current to the common collector arrangement.

U.S. Pat. No. 4,301,383, issued to Taylor, discloses a complementary insulated gate FET buffer with improved bipolar output.

The specification sheet for the Hitachi high speed LS-TTL HG 28 series gate array discloses circuits containing both bipolar and CMOS transistors which represent bi-polar-CMOS gate arrays.

U.S. Pat. No. 4,002,928 issued to Goser et al, discloses an interconnection between two MOS circuits to achieve high speed by utilizing an output stage in the first circuit to transform the signal level to a relatively low level, and an input stage in the second circuit to restore the low signal to a relatively high level.

U.S. Pat. No. 3,818,360, issued to Boutmy et al, discloses a repeater output stage for a bipolar coded signal device having two input terminals receiving signals which are of the same polarity and which are combined to produce a composite bipolar signal.

U.S. Pat. No. 4,499,387, issued to Konishi, discloses a CMOS inverter with two series connected FETs having a variable capacitor connected between the common node of the series transistor connection and a reference voltage, and a voltage generator for providing an output voltage to the variable capacitor to change the capacitance of the variable capacitor.

U.S. Pat. No. 4,424,456, issued to Shiraki et al, discloses a driver circuit for a CCD device and including a CMOS inverter, having a P channel transistor which functions to charge the load capacitance of the CCD device, and a N channel transistor which functions to discharge the equivalent load capacitance. Thus, the N channel and P channel transistors are used to adjust and optimize the charge transfer efficiency of CCD device.

U.S. Pat. No. 4,508,981, issued to Dorler et al, discloses a noise-reducing circuit, to be included in an off-chip driver circuit, for reducing self-induced switching noise in a multi-chip module semiconductor substrate.

U.S. Pat. No. 4,437,022, issued to Miersch et al, discloses an integrated push-pull driver arrangement with reduced noise generation resulting from driver switching.

U.S. Pat. No. 4,419,593, issued to Butler et al, discloses a high speed driver circuit which produces a level shifting between TTL logic levels and high voltage levels necessary to drive CCD devices.

U.S. Pat. No. 4,029,907, issued to Jorgensen et al, discloses an asynchronous digital repeater utilizing amplifiers and multivibrator arrangements to provide a repeater circuit which avoids the problem of responding to the electrical overshoot at the trailing edges of incoming pulses.

U.S. Pat. No. 3,609,479, issued to Hung Chang Lin et al, discloses semiconductor technology improvements allowing improved construction of MIS transistors and bipolar transistors on the same semiconductor substrate. Similarly. U.S. Pat. No. 4,334,196, issued to Schade, discloses vertical and lateral NPN bipolar transistors realized in CMOS technology.

Also of possible relevance, are U.S. Pat. No. 3,898,564 issued to Waldhauer et al, and U.S. Pat. No. 4,210,885 issued to Ho.

In an investigation of the long line transient time degradation problem, a number of features were found to be highly desirable in a repeater amplifier circuit. First, the repeater amplifier circuit should produce a "true" repeated signal rather an inverted signal. Next, the signal delay introduced by the repeater amplifier circuit should be kept at a minimum so it will not become of sufficient magnitude to become a concern. Finally, the repeater amplifier circuit should have high current driving capabilities such that it is capable of driving a highly capacitive load. As the prior art has been deficient in providing a repeater amplifier circuit having these advantages in conjunction, there exists a need for a repeater amplifier circuit having a true repeated output signal, minimum delay, and high current driving capabilities.

SUMMARY OF THE INVENTION

The present invention provides a unique repeater amplifier circuit to satisfy the aforementioned need. More specifically, the present invention provides a non-inverting repeater amplifier circuit which introduces minimum delay, and has an ability to drive a highly capacitive load.

The repeater amplifier circuit of the present invention utilizes a pair of CMOS current mirrors operating as a balanced source/sink to provide quiescent biasing currents to a pair of complementary bipolar output transistors. The circuit also includes two diodes and two capacitors which are used to provide both a DC circuit path for the current source/sink and also low impedance coupling of the input signal to the bipolar output transistors. The bipolar output transistors are maintained slightly ON, so that a change in the input signal causes an immediate change in the current conductivity of the bipolar output transistors. The bipolar output transistors, having high current capabilities, are able to drive highly capacitive loads. The resulting high current output signal from the bipolar transistors is in phase with the input signal, and only very slightly delayed.

Accordingly, the present invention provides a non-inverting repeater circuit for use in semiconductor circuit interconnections, the repeater circuit comprising: first and second current mirrors coupled to first and second sources of potential, respectively, the current mirrors being coupled to each other at a common circuit point forming an input to the repeater circuit; first and second output transistors connected in electrical series across the first and second sources of potential, the output transistors being coupled to each other at a common point forming an output from the repeater circuit; and non-inverting circuit means coupling the input and the repeater circuit to the first and second output transistors to produce an inphase amplified signal at the output from the repeater circuit.

The present invention additionally provides a non-inverting repeater circuit for use in semiconductor circuit interconnections, the repeater circuit comprising: repeater output means comprising first and second bipolar transistors connected in series across a first voltage terminal and a second voltage terminal, the first and second bipolar transistors being coupled together at a common point forming an output from said repeater circuit, the repeater output means producing non-inverted repeated signal waveforms in response to an input signal waveform: current means comprising: a first current mirror connected between the first voltage terminal and the base terminal of the first bipolar transistor, and a second current mirror connected between the second voltage terminal and the base terminal of the second bipolar transistor, the circuit means supplying driving currents to said first and second bipolar transistors; and repeater input means comprising a first and second control means connected in series between the base terminal of said first bipolar transistor and the base terminal of said second bipolar transistor, the first and second control means being coupled together at a common point forming an input to the repeater circuit, the repeater input means receiving an input signal and controlling the driving currents and, therefore, the operation of the repeater output means.

Finally, the present invention also provides a non-inverting repeater circuit for use in semiconductor circuit interconnections, the repeater circuit comprising: repeater output means comprising first and second bipolar transistor connected in series across a first voltage terminal and a second voltage terminal, the first and second bipolar transistor being coupled together at a common point forming an output from said repeater circuit: the repeater output means producing non-inverted repeated signal waveforms in response to an input signal waveform: current means comprising a first current mirror connected between the first voltage terminal and the base terminal of the first bipolar transistor, an a second current mirror connected between the second voltage terminal and the base terminal of the second bipolar transistor, the circuit means supplying driving currents to said first and second bipolar transistors; and repeater input means comprising a first and second control means connected in series between the base terminal of the first bipolar transistor and the base terminal of the second bipolar transistor, the first and second control means being coupled together at a common point forming an input to said repeater circuit, the repeater input means receiving an input signal and controlling the driving currents and, therefore, the operation of repeater output means by allowing the first and second current mirrors to function in a current source/sink operation through the first and second control means during the absence of an input signal, and by allowing one of the first and second means to function as a driving current source for one of the first and second bipolar transistors, respectively, during the presence of an input signal.

It is, therefore, an important object of this invention to provide a repeater amplifier circuit which is non-inverting.

It is an additional object of the present invention to provide a repeater circuit which provides a true repeated output signal.

Another object of the invention is to provide a repeater circuit which introduces minimum delay.

It is still a further object of the invention to provide a repeater circuit which has high current-driving capabilities.

These and other objects and advantages of the invention will become more fully apparent from the following description made in conjunction with the accompanying drawings, wherein:

BRIEF DESCRIPTION OF THE DRAWINGS

FIG. 1 is a simplified cross-section of a semiconductor substrate and shows a prior art circuit interconnection approach which utilizes a long circuit interconnect.

FIG. 2 is a simplified cross-section of a semiconductor substrate and shows the prior art circuit interconnection approach which utilizes a plurality of shorter circuit interconnects and repeater amplifiers.

DESCRIPTION OF THE PREFERRED EMBODIMENT

Figure 3:
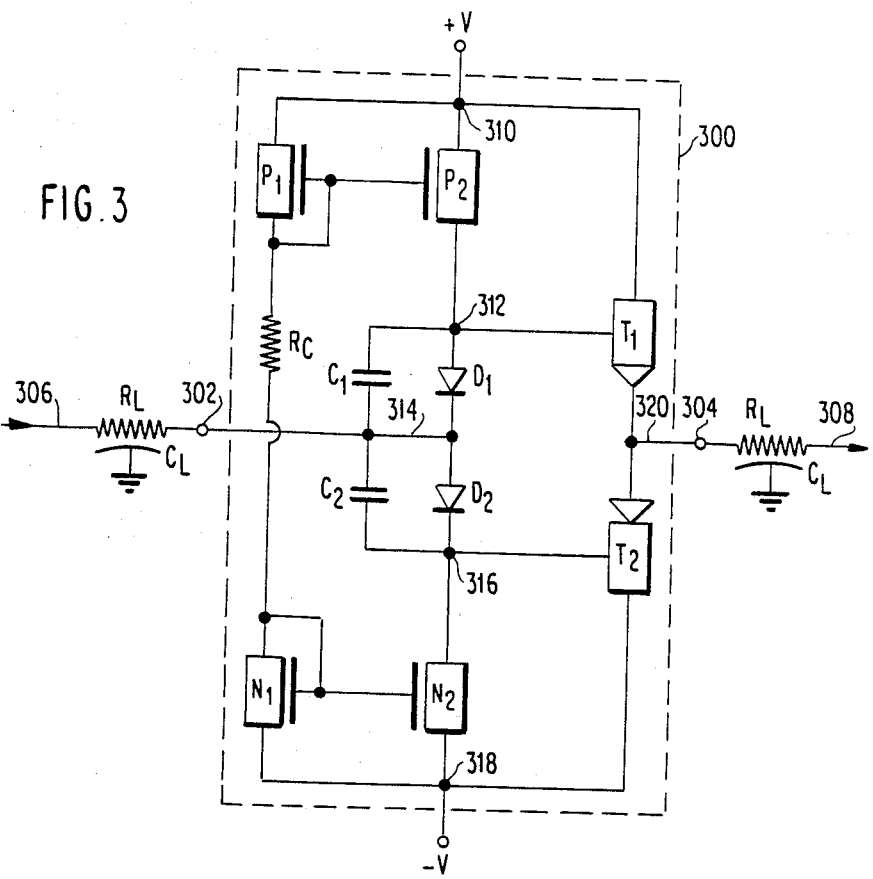
FIG. 3 is a schematic diagram showing a simplified circuit diagram of a repeater amplifier circuit representing a preferred embodiment of the present invention.

A preferred embodiment of a repeater amplifier circuit 300 of the invention is shown in FIG. 3. The repeater amplifier circuit 300 is connected to an input line 306 at an input terminal 302, and connected to an output line 308 at an output terminal 304. Shown associated with the input and output lines 306 and 308 are a line resistance $R_L$ and a line capacitance $C_L$. This repeater amplifier circuit input/output arrangement corresponds to any of the repeater amplifiers 250, 260 or 270 as shown in FIG. 2.

For example, if the repeater amplifier circuit 300 were taken to correspond to the repeater amplifier circuit 250 in FIG. 2, the line resistance $R_L$ and time capacitance $C_L$ of the input line 306 would correspond to the distributed resistance and capacitance along the circuit interconnect 200 of FIG. 2. Similarly, the line resistance $R_L$ and line capacitance $C_L$ of the output line 308 would correspond to the distributed resistance and capacitance along the circuit interconnect 201 of FIG. 2. Thus, it can be seen that the series connection of the input line 306, the repeater amplifier circuit 300 and the output line 308 of FIG. 3 would correspond to the series connection of the circuit interconnect 200, the repeater amplifier circuit 250 and the circuit interconnect 201 of FIG. 2. Note that this description applies equally well to the combination of the repeater amplifier circuit 260 with the circuit interconnects 201 and 202, or the repeater amplifier circuit 270 with the circuit interconnects 202 and 203 of FIG. 2.

Also shown as further external connections to the repeater amplifier circuit 300 are a first voltage terminal +V for applying a first source of potential, and a second voltage terminal −V for applying a second source of potential.

The external connections of the repeater amplifier circuit 300 having been described above, there will now be described the internal construction of the repeater amplifier circuit 300.

In the internal construction, the first voltage terminal +V is connected to the source terminal of a transistor $P_1$ through the node 310. The gate and drain terminals of the transistor $P_1$ are shorted together to cause the transistor $P_1$ to function as a constant current source. The drain terminal of the transistor $P_1$ is connected to a resistor $R_c$ which is, in turn, connected to the drain terminal of the transistor $N_1$. The transistor $N_1$ also has its drain terminal shorted to its gate terminal to cause the transistor $N_1$ to function as a constant current source. Finally, the source terminal of the transistor $N_1$ is connected to the second voltage terminal −V through the node 318. With the drain and gate terminals of the transistors $P_1$ and $N_1$ being shorted, the electrical series path, from the first voltage terminal +V through the transistor $P_1$, the resistor $R_c$, the transistor $N_1$ and to the second voltage terminal −V, forms a constant current branch which serves as a current standard for the repeater amplifier circuit 300.

The first voltage terminal +V is also connected to the source terminal of a transistor $P_2$ through the node 310. The gate terminal of the transistor $P_2$ is connected to the gate terminal of the transistor $P_1$. The drain terminal of the transistor $P_2$ is connected to a node 312 which, in turn, is connected to a capacitor $C_1$, the anode terminal of a diode $D_1$, and a base terminal of a bipolar transistor $T_1$. A second terminal of the capacitor $C_1$, and the cathode terminal of the diode $D_1$ are shown connected to the repeater input line 314. The repeater input line 314 is shown connected to the repeater input terminal 302.

The repeater input line 314 is also connected to a first terminal of a capacitor $C_2$ and the anode terminal of a second diode $D_2$. The second terminal of the capacitor $C_2$ and the cathode terminal of the second diode $D_2$ are, in turn, connected to a node 316. Also connected to the node 316 is the base terminal of a second bipolar transistor $T_2$ and the drain terminal of a transistor $N_2$ whose gate terminal is connected to the gate terminal of the previously described transistor $N_1$. The remaining source terminal of the transistor $N_2$ is connected to the second voltage terminal −V through the node 318.

As final internal branch of the repeater amplifier circuit 300, the collector terminal of the bipolar transistor $T_1$ is connected to the first voltage terminal +V through the node 310. The emitter terminal of the transistor $T_1$ is connected to the repeater output line 320 leading to the repeater output terminal 304. The repeater output line 320 is connected to the emitter terminal of the second bipolar transistor $T_2$. Finally, the collector terminal of the second bipolar transistor $T_2$ is connected to the second voltage terminal −V through the node 318.

In a preferred embodiment, the entire internal circuitry of the repeater amplifier circuit 300 is constructed on a semiconductor substrate using CMOS technology. Construction of circuits having both field effect transistors and bipolar transistors on the same semiconductor substrate is well known in the art as can be seen in the above referenced U.S. Pat. Nos. 3,609,479; 4,334,196: 4,301,383: and 4,159,450, whose teachings are incorporated herein by reference.

Figure 4:
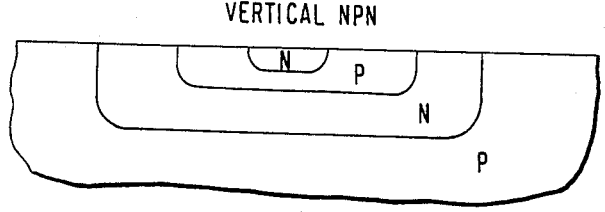
FIG. 4 is a simplified cross-sectional view of a vertical NPN transistor formed in an N well of a CMOS process.
Figure 6:
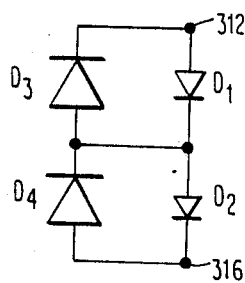
FIG. 6 is a schematic diagram illustrating control means being implemented using a first diode and a second larger and oppositely-connected diode.

In the preferred embodiment of the repeater amplifier circuit, the first bipolar transistor $T_1$ is a vertical NPN transistor constructed in an N well of a CMOS process. A simplified diagram of such a construction is illustrated in FIG. 4. One of the characteristics of such a construction is that considerable collector series resistance is tolerable in this circuit.

Figure 5:
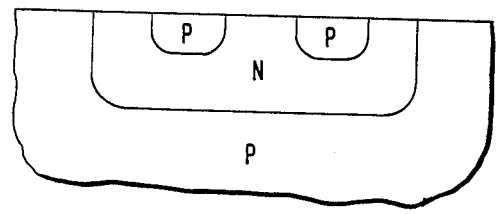
FIG. 5 is a simplified cross-sectional view of a lateral PNP transistor formed in an N well of a CMOS process.

Also, in a preferred embodiment of the repeater amplifier circuit 300, the second bipolar transistor $T_2$ is a lateral PNP transistor constructed in an N well of a CMOS process. A simplified diagram of this construction is illustrated in FIG. 5. One of the characteristics of a lateral transistor of this construction is that holes collected by the P substrate are not a problem, because the transistor is operated in a grounded-collector mode.

In further regard to the construction aspects of the repeater amplifier circuit 300, the first diode $D_1$ is made using the same construction as that for the first bipolar transistor $T_1$, but the diode construction is proportioned significantly smaller than the construction for the transistor $T_1$. The base and collector of the diode construction are shorted together to form a diode, rather than a transistor. The second diode $D_2$ is similarly constructed and proportioned with reference to the second bipolar transistor $T_2$.

The capacitors $C_1$ and $C_2$ are included to provide a low impedance coupling path from the input terminal to the base terminal of the bipolar output transistors. This low impedance path may be formed by constructing $C_1$ and $C_2$ using any of the well known semiconductor capacitor construction approaches, and in a preferred embodiment the capacitors may be additional diode constructions which are significantly large in size and reverse-biased.

Finally, in a preferred embodiment, the transistors $P_1$ and $P_2$ are field effect transistors of P channel construction, and the transistors $N_1$ and $N_2$ are field effect transistors of N channel construction.

In the operation of the above-described device, the series path, from the first voltage terminal +V and through the transistor $P_1$, the current limiting resistor $R_c$ and the transistor $N_1$, and then to the second voltage terminal −V, forms a constant current source whose current is largely determined by the potential across the two voltage terminals and the current limiting resistor $R_c$. This constant current source arrangement is used as a standard with which to control the currents through the transistors $P_2$ and $N_2$.

In the connection shown in FIG. 3, the combination of the transistors $P_1$ and $P_2$ operates as a first current mirror, and the combination of the transistors $N_1$ and $N_2$ functions as a second current mirror. If the transistor $P_2$ is constructed in the same manner and size as that of the transistor $P_1$, and if the transistor $N_2$ is constructed in the same manner and size as that of the transistor $N_1$, then the currents through the transistors $P_2$ and $N_2$ will substantially match the currents through the transistors $P_1$ and $N_1$, respectively. In the alternative, a current which is different from, but proportional to, the current flowing in the constant current source branch can be produced by providing a proportional increase or decrease in the size of the transistors $P_2$ and $N_2$ relative to the transistors $P_1$ and $N_1$, respectively. In any event, the first current mirror and the second current mirror are constructed such that they function as a balanced source and current sink, respectively. Since the current through the transistors $P_2$ and $N_2$ is proportional to the current flowing through the constant current source branch, the value of the balanced source/sink current is largely determined by the potential difference across the first and second voltage terminals and the current limiting resistor $R_c$.

In a practical design of the repeater amplifier circuit 300, all four field effect transistors are designed with a sufficiently high width/length ratio such that the current source/sink remains essentially constant over the entire dynamic range of the repeater amplifier circuit, thereby insuring that the amplification operation performed by the repeater amplifier circuit is linear over the entire dynamic range of the input signal.

During an absence of an input signal, the majority of the balanced source/sink current flows through the first and second diodes $D_1$ and $D_2$. A small portion of the balanced source/sink current is used to bias the bipolar transistors $T_1$ and $T_2$ ON at a modest quiescent current. During the impression of an input signal, the input signal current is allowed to flow through the low impedance capacitors $C_1$ and $C_2$ to upset the balance of the source/sink current and provide additional current, such that one of the bipolar transistors $T_1$ or $T_2$ is sharply turned ON and the other sharply turned OFF. As an example, if a positive-going transient input signal is applied to the repeater amplifier input terminal 302, the first diode $D_1$ is turned OFF while the first bipolar transistor $T_1$ is sharply turned ON, and the second diode $D_2$ is turned ON while the second bipolar transistor $T_2$ is sharply turned OFF. The opposite would be true should a negative-going transient input signal be applied to the repeater amplifier input terminal 302.

Several important design features of the repeater amplifier circuit 300 in FIG. 3 should be pointed out. First, the bipolar output transistors $T_1$ and $T_2$ are configured in an emitter-follower mode of operation. With the circuit arrangement shown in FIG. 3, these emitter-followers produce an output signal which is a true repeat of the signal applied to the repeater amplifier input terminal 302, rather than an inverted output signal.

Next, it should be noted that since the repeater amplifier circuit 300 is also configured in a grounded-collector arranagement, parameter requirements for the bipolar transistors are made easier. For example, since the collector nodes of the bipolar output transistors are at fixed potentials, collector-substrate capacitance, which otherwise would have slowed the operation of the circuit, is not a concern. Similarly, series collector resistances (which have been avoided in the signal path) are also not a concern. The bipolar output transistors are, thus, able more easily to be realized using CMOS technology. The emitter-follower arrangement with grounded collectors is also the fastest response configuration available with the bipolar output transistors. Thus, the output configuration chosen is such that a minimum delay is introduced by the repeater amplifier circuit 300.

Finally, as the output configuration is constructed of bipolar transistors, the repeater amplifier circuit 300 has a high current capability which produces the ability to drive highly capacitive loads. Even though this circuit loses approximately 700 milivolts from each end of the signal swing because of the outage drops across the P-N junctions, this loss, which is not cumulative with multiple repeater amplifier stages, is not a significant factor in the operation of the device.

The above-described embodiment of the present invention provides a repeater amplifier circuit in which the repeated output signal is not inverted, only a minimum delay is introduced, and which is able to drive a highly capacitive load. This repeater amplifier circuit is particularly useful in realizing semiconductive circuit interconnections which avoid the transient time degradation problem.

The present invention and many of its attendant advantages will be understood from the foregoing description, and it will apparent that various changes may be made in the form, construction, and arrangements of the parts thereof without departing from the spirit and scope of the invention, the form herein before described above being merely a preferred or exemplary embodiment of the invention whose scope is defined by the following claims.

What is claimed is:

1. A non-inverting repeater circuit for use in semiconductor integrated circuit interconnections, said repeater circuit comprising:

first and second current mirrors coupled to first and second sources of potential, respectively;

first and second bipolar output transistors connected in electrical series across said first and second sources of potential, said output transistors being coupled to each other at a common point forming an output from the repeater circuit and having a base terminals connected to said first and second current mirrors, respectively;

first and second biasing control means having semiconductor constructions which are proportional to semiconductor constructions of said first and second bipolar output transistors and being connected across base terminals of said first and second bipolar output transistors such that said first and second biasing control means are used to control biasing of said first and second bipolar output transistors, a common point between said first and second biasing control means forming an input to the repeater circuit: and non-inverting circuit means coupling the input of the repeater circuit to base terminals of said first and second bipolar output transistors, to produce an in-phase amplified signal at the output from the repeater circuit.

2. A non-inverting repeater circuit as claimed in claim 1, wherein said first and second current mirrors are P-channel and N-channel FET transistors, respectively.

3. A non-inverting repeater circuit as claimed in claim 1, wherein said first and second bipolar output transistors are NPN and PNP bipolar transistors, respectively.

4. A non-inverting repeater circuit as claimed in claim 3, wherein said NPN and PNP bipolar transistors are connected to operate in an emitter-follower mode of operation.

5. A non-inverting repeater circuit as claimed in claim 1, wherein said repeater circuit is formed in a semiconductor substrate using CMOS technology.

6. A non-inverting repeater circuit as claimed in claim 1, wherein said first and second bipolar output transistors are coupled to each other at a common point by their respective emitter terminals.

7. A non-inverting repeater circuit as claimed in claim 1, wherein said non-inverting circuit means comprises a first diode and a second diode coupling the input of the repeater circuit to the first and second bipolar output transistors, respectively.

8. A non-inverting repeater circuit for use in semiconductor integrated circuit interconnections, said repeater circuit comprising:
   repeater output means comprising first and second bipolar transistors connected in series across a first voltage terminal and a second voltage terminal, said first and second bipolar transistor being coupled together at a common point forming an output from said repeater circuit, said repeater output means producing non-inverted repeated signal waveforms in response to an input signal waveform;
   FET current means comprising: a first FET current mirror connected between said first voltage terminal and the base terminal of said first bipolar transistor, and a second FET current mirror connected between said second voltage terminal and the base terminal of said second bipolar transistor, said FET current means supplying quiescent driving currents to said first and second bipolar transistors; and
   repeater input means comprising first and second biasing control means connected in series between the base terminal of said first bipolar transistor and the base terminal of said second bipolar transistor, said first and second biasing control means having semiconductor constructions which are proportional to semiconductor constructions of said first and second bipolar transistors and being coupled together at a common point forming an input to said repeater circuit, said repeater input means receiving an input signal and controlling the operation of said repeater output means in response to said input signal.

9. A non-inverting repeater circuit as claimed in claim 8 wherein said first bipolar transistor is an NPN transistor, and said second bipolar transistor is a PNP transistor.

10. A non-inverting repeater circuit as claimed in claim 8 wherein said repeater circuit is formed in a semiconductor substrate using CMOS technology.

11. A non-inverting repeater circuit as claimed in claim 8 wherein said first and second bipolar transistors are connected to operate in an emitter follower mode of operation.

12. A non-inverting repeater circuit as claimed in claim 8, wherein said first and second bipolar transistors are coupled together at said common point by the transistors' emitter terminals.

13. A non-inverting repeater circuit as claimed in claim 8, wherein said repeater input means controls said driving currents, and, thereby, the operation of said repeater output means, by allowing said first and second current mirrors to function in a current source/sink operation through said first and second biasing control means during the absence of an input signal, and, by allowing one of said first and second current mirrors to supply driving current to one of said first and second bipolar transistors, respectively, during the presence of an input signal.

14. A non-inverting repeater circuit as claimed in claim 8, wherein said first current mirror is constructed of at least one P-channel field-effect transistor, and wherein said second current mirror is constructed of at least one N-channel field-effect transistor.

15. A non-inverting repeater circuit as claimed in claim 8, wherein said first and second biasing control means are diodes.

16. A non-inverting repeater circuit for use in semiconductor integrated circuit interconnections, said repeater circuit comprising:
   repeater output means comprising complementary first and second bipolar transistors connected in series across a first voltage terminal and a second voltage terminal, said first and second bipolar transistors being coupled together at a common point forming an output from said repeater circuit, said repeater output means producing non-inverted repeated signal waveforms in response to an input signal waveform;
   FET current means comprising a first FET current mirror connected between said first voltage terminal and the base terminal of said first bipolar transistor, and a second FET current mirror connected between said second voltage terminal and the base terminal of said second bipolar transistor, said FET current means supplying quiescent driving currents to said first and second bipolar transistors; and
   repeater input means comprising a first and second biasing control means connected in series between the base terminal of said first bipolar transistor and the base terminal of said second bipolar transistor, said first and second biasing control means having semiconductor constructions which are proportional to semiconductor constructions of said first and second bipolar transistors and being coupled together at a common point forming an input to said repeater circuit, said repeater input means receiving an input signal and controlling said driving currents and, thereby, the operation of said repeater output means by allowing said first and second current mirrors to function in a current source/sink operation through said first and second biasing control means during the absence of an input signal, and by allowing one of said first and second current mirrors to function as a driving current source for one of said first and second bipolar transistors, respectively, during the presence of an input signal.

17. A non-inverting repeater circuit as claimed in claim 16 wherein said first bipolar transistor is an NPN transistor, and said second bipolar transistor is a PNP transistor.

18. A non-inverting repeater circuit as claimed in claim 16 wherein said repeater circuit is fabricated in a semiconductor substrate using CMOS technology.

19. A non-inverting repeater circuit as claimed in claim 16 wherein said first and second bipolar transistors are connected to operate in an emitter-follower mode of operation.

20. A non-inverting repeater circuit as claimed in claim 19, wherein said first and second bipolar transistors are coupled together at said common point by emitter terminals.

21. A non-inverting repeater circuit as claimed in claim 16, wherein said first FET current mirror is constructed of at least one P-channel field-effect transistor, and wherein said second FET current mirror is constructed of at least one N-channel field-effect transistor.

22. A non-inverting repeater circuit as claimed in claim 16, wherein said first and second biasing control means are diodes.

23. A non-inverting repeater circuit for use in semiconductor integrated circuit interconnections, said repeater circuit being implemented in Bi-CMOS technology and comprising:

repeater output means comprising complementary first and second bipolar transistors of a connected in series across a first voltage terminal and a second voltage terminal, said first and second bipolar transistors being coupled together at a common point forming an output from said repeater circuit, said repeater output means producing non-inverted repeated signal waveforms in response to an input signals waveform;

FET current means comprising a first FET current mirror connected between said first voltage terminal and the base terminal of said first bipolar transistor, and a second FET current mirror connected between said second voltage terminal and the base terminal of said second bipolar transistor, said FET current means supplying quiescent driving currents to said first and second bipolar transistors; and repeater input means comprising a first and second biasing control means having semiconductor constructions which are proportional to semiconductor constructions of said first and second bipolar transistors and being connected in series between the base terminal of said first bipolar transistor and the base terminal of said second bipolar transistor, said first and second biasing control means being coupled together at a common point forming an input to said repeater circuit, said repeater input means providing a direct current path such that said first and second FET current means operate in a balanced source/sink arrangement during the absence of an input signal, said repeater input means also providing a low impedance path from said input to said first and second bipolar transistors.

24. A non-inverting repeater circuit as claimed in claim 23 wherein said first bipolar transistor is an NPN transistor, and said second bipolar transistor is a PNP transistor.

25. A non-inverting repeater circuit as claimed in claim 23 wherein said first and second bipolar transistors are connected to operate in an emitter follower mode of operation.

26. A non-inverting repeater circuit as claimed in claim 25, wherein said first and second bipolar transistors are coupled together at said common point by emitter terminals.

27. A non-inverting repeater circuit as claimed in claim 23, wherein said first FET current mirror is constructed of at least one P-channel field-effect transistor, and wherein said second FET current mirror is constructed of at least one N-channel field-effect transistor.

28. A non-inverting repeater circuit as claimed in claim 23, wherein said first and second biasing control means are diodes.

29. A non-inverting repeater circuit as claimed in claim 23, wherein each of said first and second biasing control means comprises a diode and a capacitor connected in parallel, said diode providing said direct current path, and said capacitor providing said low impedance path.

30. A non-inverting repeater circuit as claimed in claim 23, wherein each of said first and second biasing control means comprises a first diode and a second larger and oppositely-connected diode, said first diode providing said direct current path, and said second diode providing said low impedance path.

* * * * *